United States Patent [19]

Sojka

[11] Patent Number: 4,908,524
[45] Date of Patent: Mar. 13, 1990

[54] HIGH VOLTAGE PULSE POWER CONVERTER

[75] Inventor: Richard J. Sojka, Placentia, Calif.

[73] Assignee: Rockwell International Corporation, El Segundo, Calif.

[21] Appl. No.: 307,819

[22] Filed: Feb. 8, 1989

[51] Int. Cl.$^4$ .............................................. H02M 9/04
[52] U.S. Cl. ..................... 307/107; 307/108; 372/38; 372/82
[58] Field of Search ............... 307/107, 108; 372/38, 372/82; 315/242; 378/106; 328/233

[56] References Cited

U.S. PATENT DOCUMENTS

| | | | |
|---|---|---|---|
| 3,351,870 | 11/1967 | Goldsmith et al. | |
| 3,515,938 | 6/1970 | Morse | 372/38 |
| 3,711,725 | 1/1973 | Johannessen | 307/108 |
| 3,766,492 | 10/1973 | Rosati | 331/94.5 |
| 4,549,091 | 10/1985 | Fahlen et al. | 307/106 |
| 4,677,636 | 6/1987 | Laudenslager et al. | 372/68 |
| 4,698,518 | 10/1987 | Pacala | 307/106 |
| 4,745,613 | 5/1988 | Tye et al. | 372/81 |

FOREIGN PATENT DOCUMENTS

| | | | |
|---|---|---|---|
| 299233 | 1/1989 | European Pat. Off. | 307/108 |
| 60879 | 4/1982 | Japan | 372/82 |

Primary Examiner—William H. Beha, Jr.
Attorney, Agent, or Firm—H. Fredrick Hamann; George A. Montanye; Tom Streeter

[57] ABSTRACT

A high voltage pulse power converter comprises a modified type E pulse charging network (74) in series with a nonlinear magnetic switch (76). The network comprises a ladder of charging elements (78) each of which comprises a shunt section of a pulse charging module (80) in parallel with a pulse receiving capacitor (82), and a series section comprising an inductance (84). The pulse charging module (80) steps up power from a low voltage power supply (102) through a transformer (110) to charge the pulse receiving capacitors (82); the pulse receiving capacitors (82) discharge simultaneously when sufficient volt seconds have been applied to the nonlinear magnetic switch (76).

6 Claims, 7 Drawing Sheets

HIGH VOLTAGE PULSE POWER CONVERTER

TECHNICAL FIELD

This invention relates to apparatus for converting low voltage power to high voltage power, and has particular relation to apparatus for convertng low voltage power to high voltage power which comes in DC pulses.

BACKGROUND ART

The conventional means for converting low voltage (e.g., 28 volt DC) power is two stage. The first stage is that power from a low voltage source is converted into high voltage by a flyback converter. The high voltage from the flyback converter passes through a type E pulse forming network and into a load. This passage is regulated by a thyratron, which is triggered on and off by thyratron auxiliary electronics.

The foregoing conventional apparatus for supplying pulse power is suitable when weight, radiation hardness, and volume are not critical. When they are critical, however, an entirely different apparatus, such as the one described in the present invention, is more suitable for converting low voltage to high voltage pulse power.

SUMMARY OF THE INVENTION

It is an objective of the present invention to provide a high voltage pulse power converter which is radiation hard, reliable, light weight, and compact.

It is a feature of the present invention that a nonlinear magnetic switch is used instead of a thyratron.

It is an advantage of the present invention that no radiation soft auxiliary electronics need to be provided to support the switch.

It is a further feature of the present invention that a plurality of low voltage power sources feed a comparable plurality of transformers, which separately charge a comparable plurality of pulse receiving capacitors.

It is a further advantage of the present invention that the failure of any of the power supplies will reduce, but not destroy, the usefulness of the power converter.

It is a further advantage of the present invention that each of the plurality of power supplies is lighter and more compact than a single large power supply, as shown in the background art. Indeed, the combined weight and volume of the small power supplies may often be less than that of a single large power supply.

In accordance with the present invention, a high voltage pulse power converter comprises a nonlinear magnetic switch and a ladder of charging elements connected in series with the switch. Each charging element comprises a shunt section and a series section.

In one embodiment, the shunt section is connected between a first node and a second node and comprises a pulse charging module and a pulse receiving capacitor connected in parallel with the pulse charging module. The pulse charging module includes means for receiving low voltage power and means for producing and delivering high voltage power to the pulse receiving capacitor. The series section is connected between the second node and the third node, and comprises an inductance.

The first node of each element other than a highest element is connected to the first node of the next higher element. This forms a common first node of the ladder as a whole. The third node of each element other than the highest element is connected to the second node of the next higher element. The third node of the highest element forms a third node of the ladder as a whole.

The nonlinear magnetic switch is connected in series with the first or third node of the ladder.

Advantageously, each pulse charging module comprises an intermediate storage capacitor connected to be charged by the low voltage power receiving means, and a voltage step up transformer including a primary winding and a secondary winding. Means are provided for intermittently discharging the intermediate storage capacitor through the primary winding, and further means are provided for outputting high voltage pulse power from the secondary winding to the pulse receiving capacitor.

The invention may also be viewed as a method of converting low voltage power to high voltage pulse power, comprising four steps. The first step comprises transforming, at each of a plurality of ladder connected charging elements, low voltage power to high voltage power. The second step comprises charging each of charging element with high voltage power. The third step comprises discharging each charging element other than a highest element into a next highest charging element. The fourth step comprises discharging the highest charging element through a nonlinear magnetic switch.

Each charging element may be charged by receiving low voltage power at a pulse charging module, transforming it to high voltage power, and delivering the high voltage power to a pulse receiving capacitor. Each charging element is discharged by discharging the pulse receiving capacitor through an inductance.

The step of charging each charging element may comprise charging an intermediate storage capacitor with the low voltage power, intermittently discharging the intermediate storage capacitor through a primary winding of a transformer, and outputting pulse power from a secondary winding of the transformer to a pulse receiving capacitor.

The features of the present invention when viewed as an apparatus may also be applied to the present invention when viewed as a method.

PREFERRED EMBODIMENT FOR CARRYING OUT THE INVENTION

Figure 1:
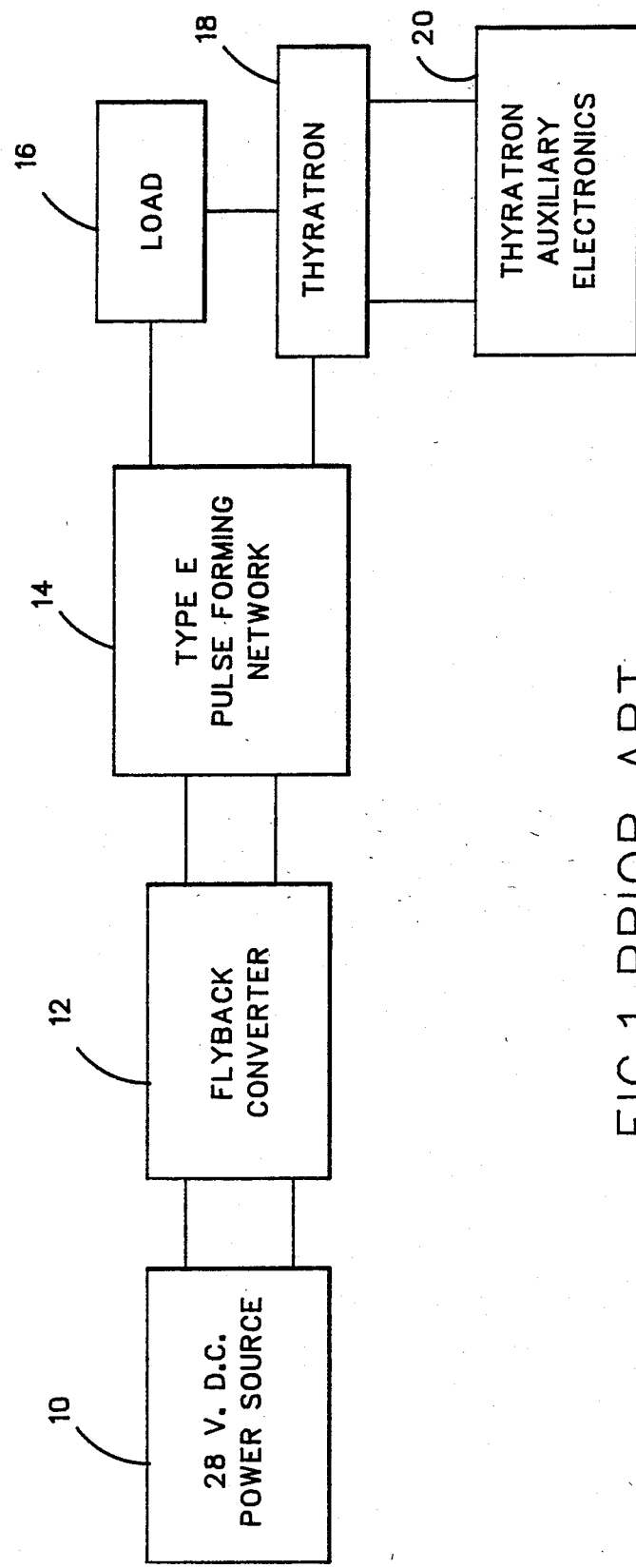
FIG. 1 shows a prior art pulse power generator in block form.

The conventional means for converting low voltage (e.g., 28 volt DC) power is two stage. As is seen in FIG. 1, the first stage is that power from a low voltage source 10 is converted into high voltage by a flyback converter 12. The high voltage from the flyback converter 12 passes through a type E pulse forming network 14 and into a load 16. This passage is regulated by a thyratron 18, which is triggered on and off by thyratron auxiliary electronics 20.

Figure 2:
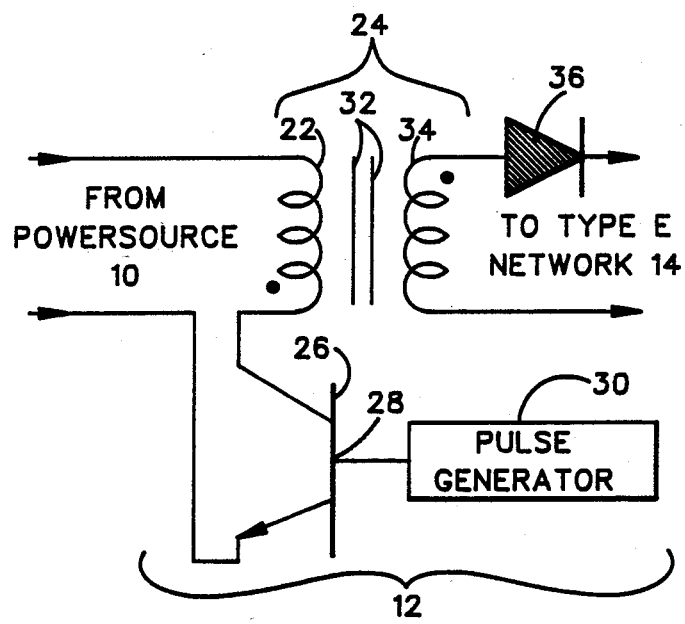
FIG. 2 is a detailed view of the flyback converter which forms part of FIG. 1.
Figure 3:
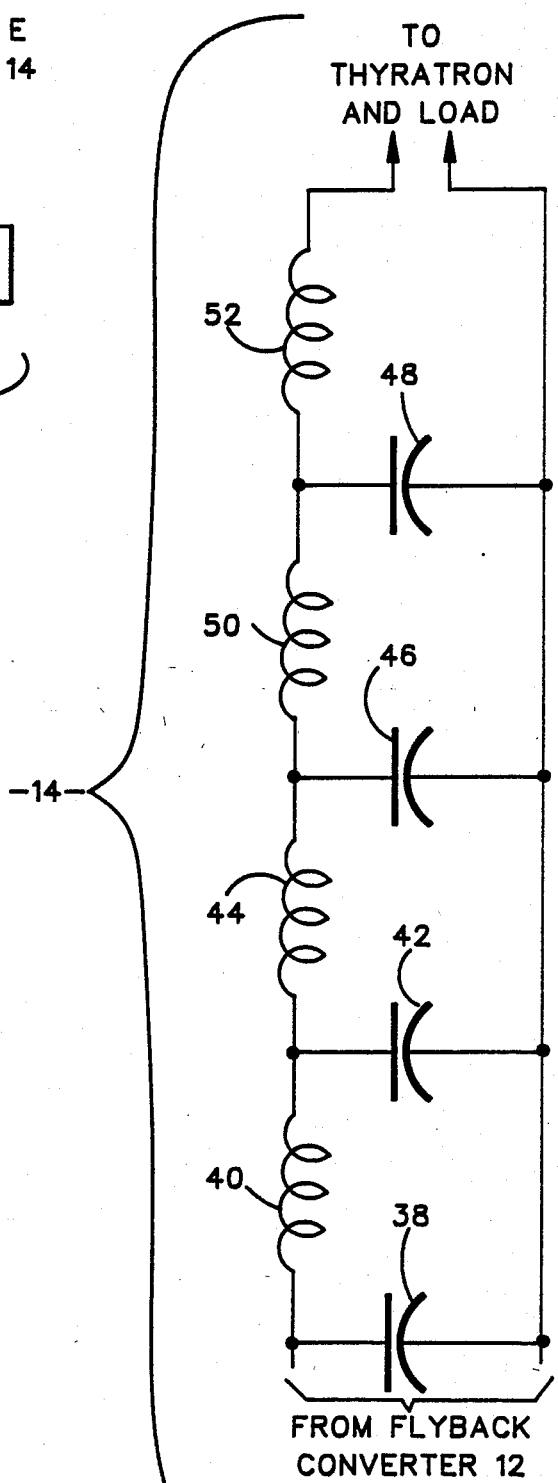
FIG. 3 is a detailed view of the type E pulse forming network which forms a part of FIG. 1.
Figure 4:
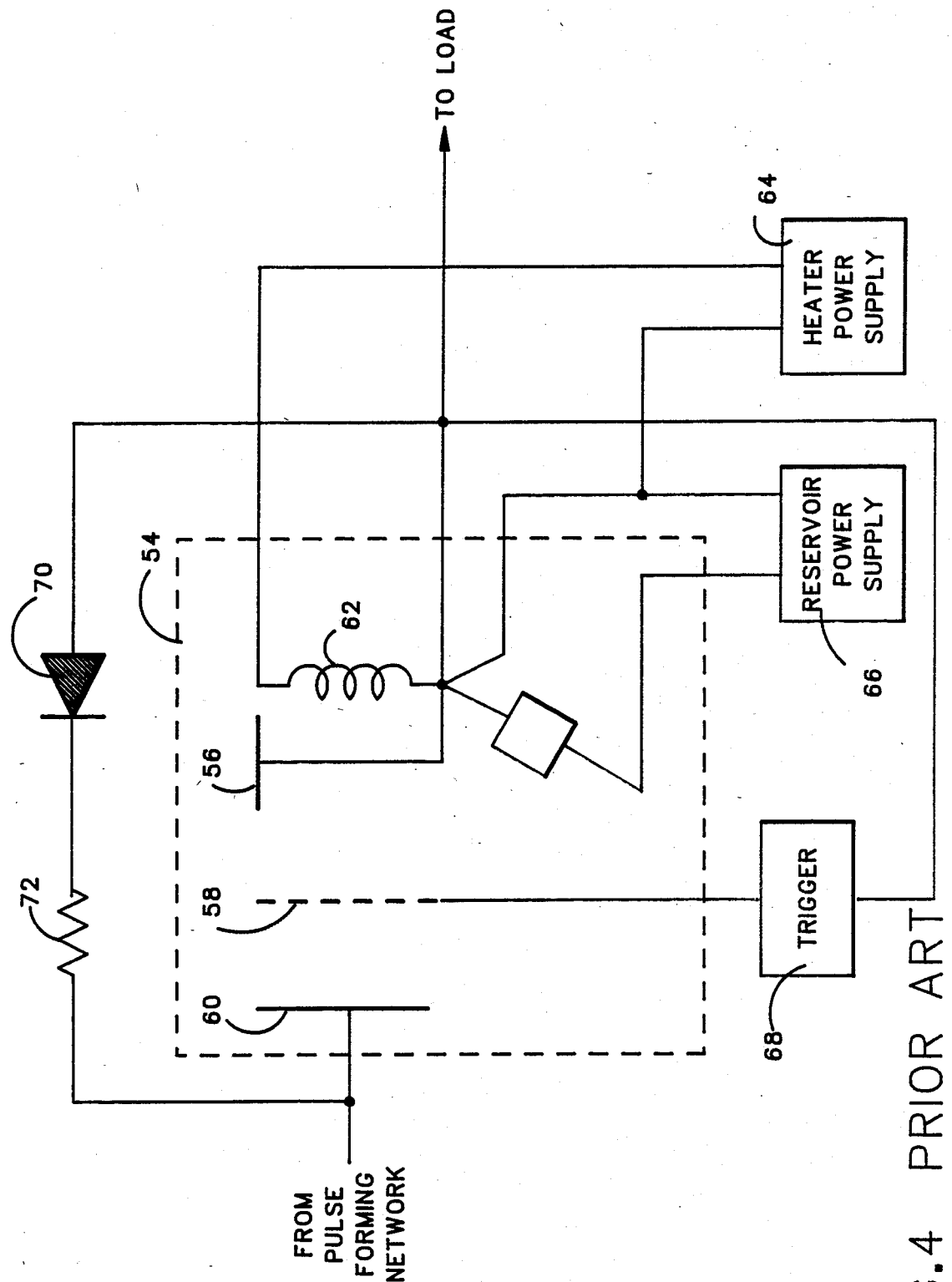
FIG. 4 shows a detailed view of the thyratron and associated electronics which form a part of FIG. 1.

This prior art is shown in more detail in FIGS. 2–4. Turning to FIG. 2, a flyback converter is shown wherein power, typically direct current but not necessarily, from the power source 10 enters the primary winding 22 of a transformer 24. From there it passes through a transistor 26, the gate 28 of which receives pulses from a pulse generator 30. The Wavetek (San Diego, Calif.) Model 802 is suitable. The transistor 26 is therefore intermittently turned on and off. Every time it turns off, the magnetic flux in the core 32 must be discharged, and there is no way to discharge it other than through the secondary winding 34, which has many more turns. The voltage across the secondary winding 34 is therefore much higher than that coming through the primary winding 22. A diode 36 rectifies this voltage if it is an alternating voltage. This is not necessary, except to control transient back voltages, if the power entering the primary winding 22 is a direct current power.

Turning now to FIG. 3, this high voltage pulse is stored in a capacitor 38. It simultaneously enters an inductance 40, and, having passed through the inductance 40, enters a second capacitor 42. As it enters the second capacitor 42, it simultaneously enters a second inductance 44, and so on through capacitances 46 and 48, and inductances 50 and 52. The capacitances 38, 42, 46, and 48 are in parallel, with their low voltage sides being connected together. The inductances 40, 44, 50, and 52 are connected between the high voltage sides of the corresponding capacitances. Each inductance and capacitance forms a charging element. The inductances, capacitances, and mutual inductance between inductances are adjusted, as is well known in the art, to produce the correct impedance for the particular flyback converter and load in use.

Turning now to FIG. 4, a thyratron 54 comprises a cathode 56, grid 58 and anode 60. The cathode 56 is heated by a heater 62, the heater receives power from a separate heater power supply 64, and reservoir power is supplied by a reservoir power supply 66. When a pulse from a trigger 68 enters the grid 58, the thyratron becomes conductive, discharging the capacitors 38, 42, 46, and 48, and allowing a massive power pulse to pass through it, and thus to pass through the load. A diode 70 suppresses back pulses, and transient voltages may be dissipated through a resistor 72.

Figure 5:
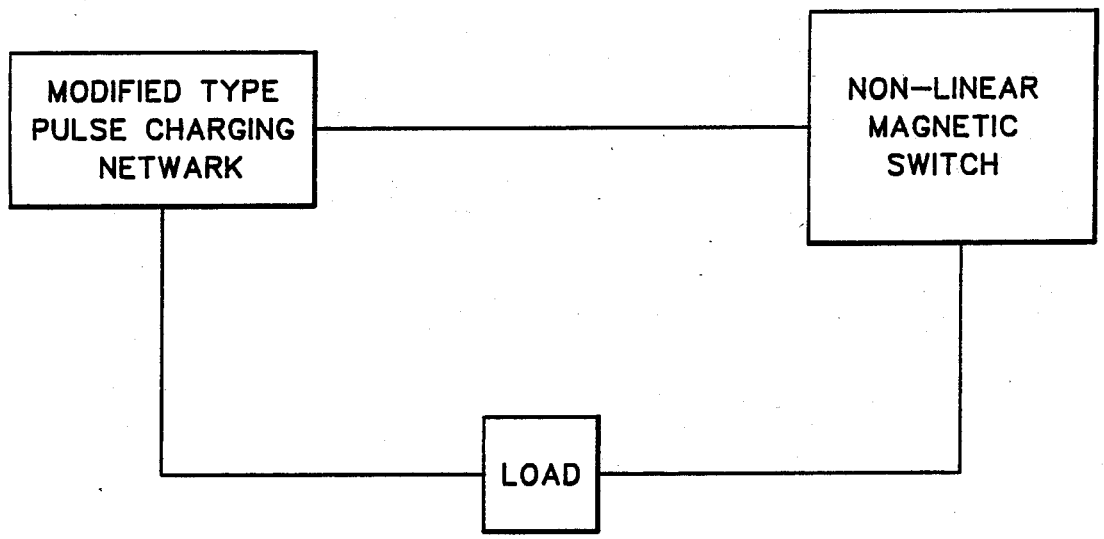
FIG. 5 shows the present invention in block form.

In the present invention, shown in block form in FIG. 5, the type E pulse forming network is modified into a pulse charging network 74, and the thyratron and its auxiliary electronics are replaced by a nonlinear magnetic switch 76. Applicant prefers a saturable inductor as the nonlinear magnetic switch 76. The nonlinear magnetic switch requires no auxiliary electronics and is, therefore, inherently radiation hard. Its use with a conventional type E pulse forming network would be inappropriate since it would have to be too bulky and heavy. However, with the pulse charging network shown in FIG. 6, it may be much smaller and lighter.

Figure 6:
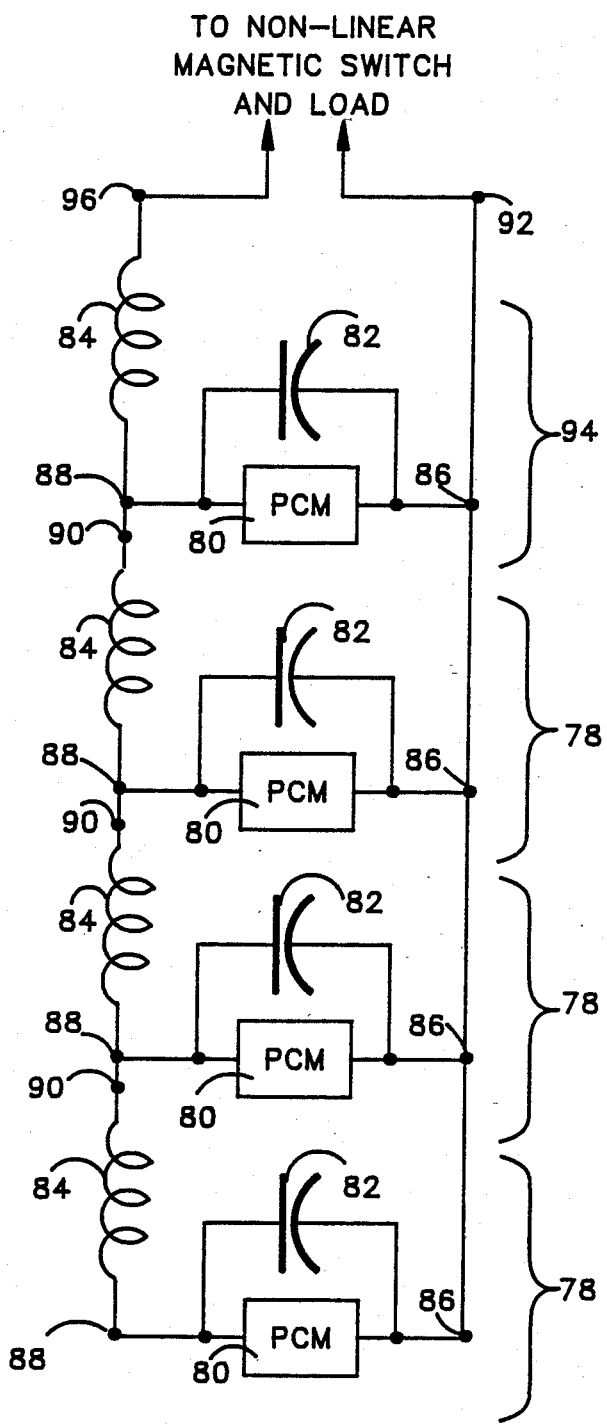
FIG. 6 shows a detailed view of the modified type E pulse charging network of the present invention.

Turning now to FIG. 6, the pulse charging network 74 comprises a series of charging elements 78, each charging element comprising a pulse charging module (PCM) 80, a pulse receiving capacitor 82, and an inductor 84.

The pulse charging module 80 and pulse receiving capacitor 82 are connected in parallel between a first node 86 and a second node 88. The inductor 84 is connected between the second node 88 and a third node 90. The first nodes 86 of the several charging elements 78 are connected together to form a ladder as a whole first node 94. Every charging element 78, except for a highest charging element 94, has its third node 90 connected to the second node 88 of a next higher charging element 78. The highest element 94 has, of course, no next higher element. Its third node 96 is therefore not connected to any second node 88 of any next higher charging element 78. Instead, the third node 96 of the highest charging element 94 forms a third node of the ladder as a whole.

Figure 7:
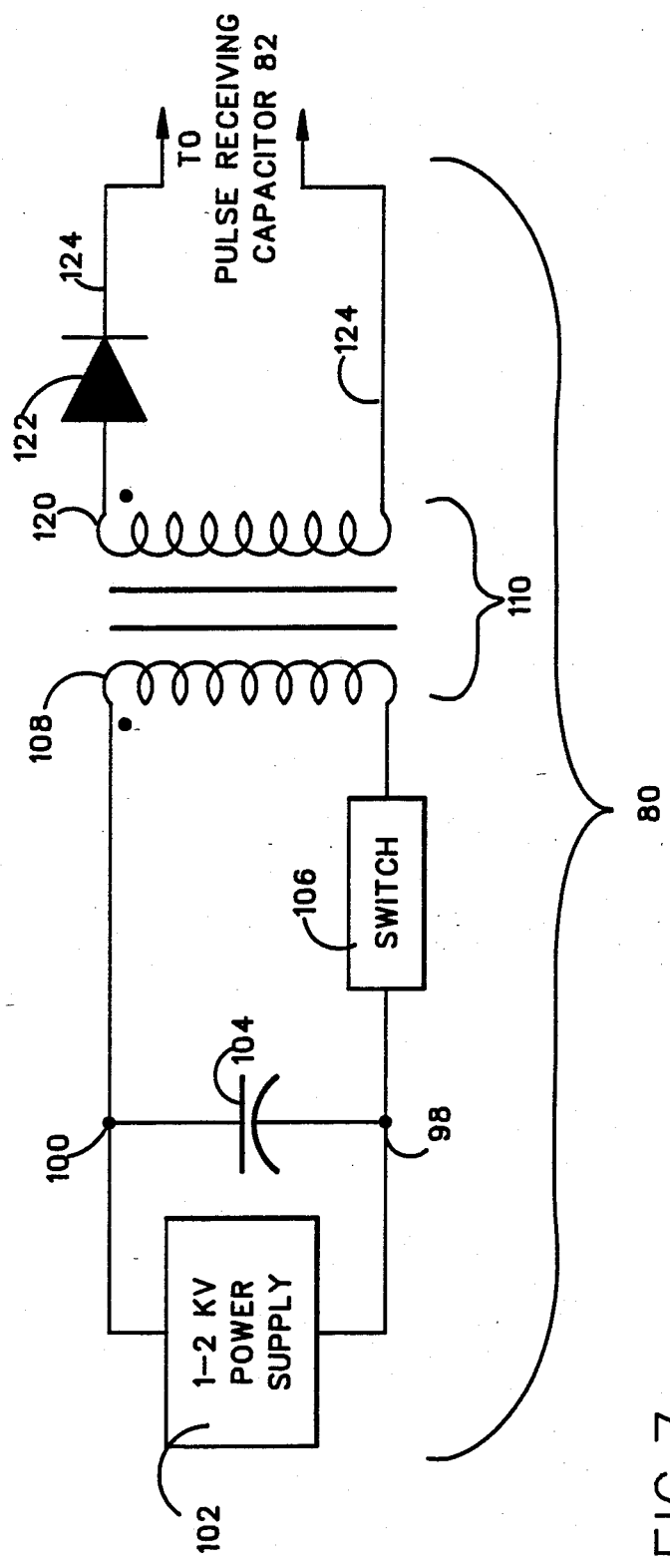
FIG. 7 shows a detailed view of a pulse charging module as appears in FIG. 6.

Turning now to FIG. 7, the details of a pulse charging module 80 are shown. Means are provided, such as the nodes 98 and 100, for receiving low voltage power from a low voltage power supply 102 which may provide power at, for example, 1 to 2 kilovolts. The low voltage power supply 102 charges up an intermediate storage capacitor 104, which is intermittently discharged by a switch 106 through the primary winding 108 of a 1:n transformer 110.

Figure 8:
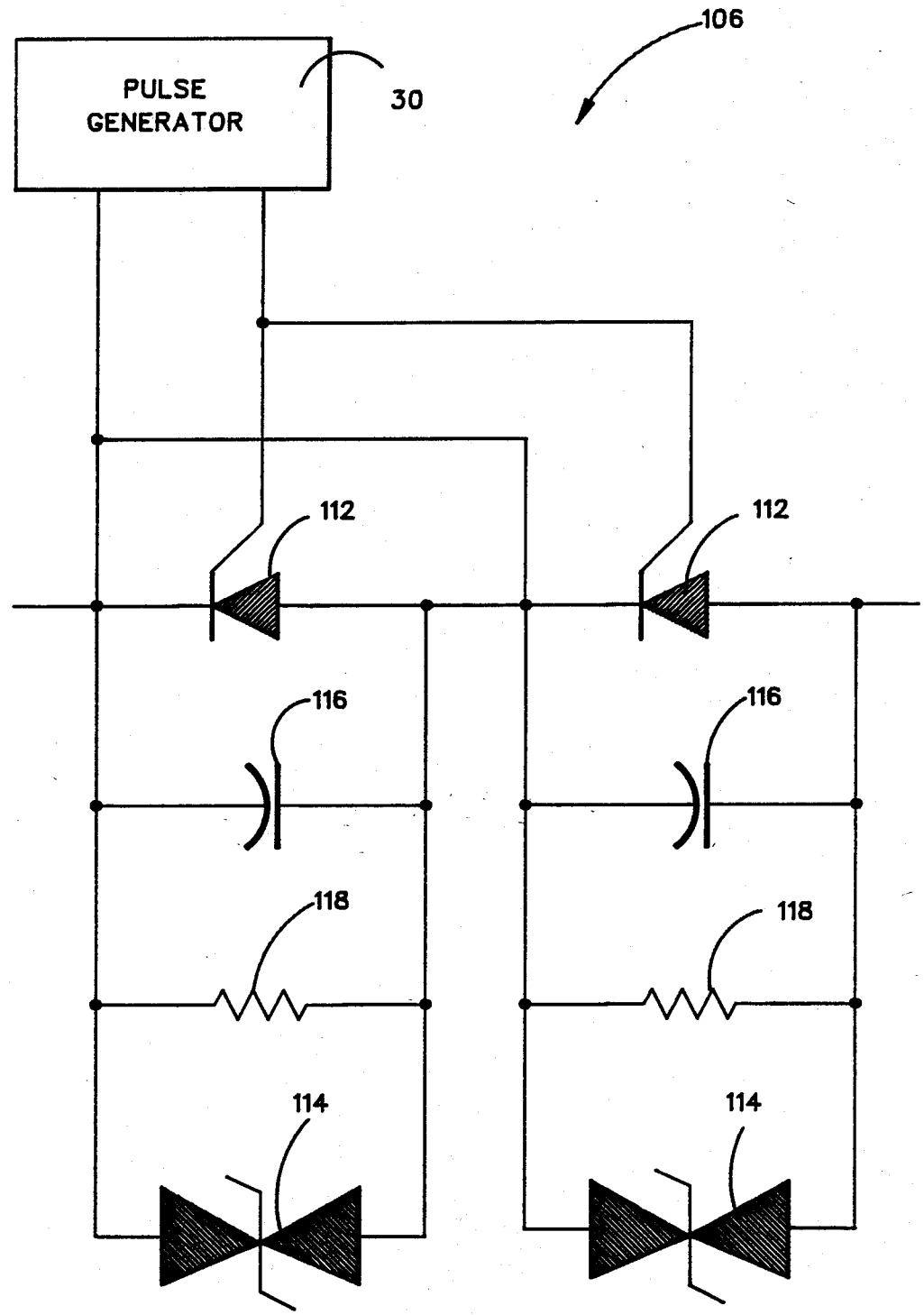
FIG. 8 shows a detailed view of a switch.

The switch 106 may be a pulsed transistor, such as the prior art transistor 26 (FIG. 2). A pair of series connected pulsed silicon controlled rectifiers 112 is also suitable (FIG. 8). If desired, each rectifier 112 may be connected in parallel with a double ended Zener diode 114 (to clamp the voltage), a capacitor 116 (to divide the voltage), and a resistor 118 (to discharge the capacitor). Other switches will occur to those skilled in the art.

The resultant high voltage intermediate power pulse from a secondary winding 120 of the transformer 110 is passed through a diode 122 to the pulse receiving capacitor 82. The diode 122 prevents the pulse receiving capacitor 82 from discharging back through the secondary winding 120 between the pulses created by switch 106. The diode 122 is connected between the secondary winding 120 and the pulse receiving capacitor 82 by a wire or other conductor 124.

Operation of the foregoing apparatus is apparent from the foregoing description. The pulse charging modules 80 charge up the pulse receiving capacitors 82 to a high voltage, perhaps twenty kilovolts. This voltage is impressed upon the nonlinear magnetic switch 76. It is a characteristic of nonlinear magnetic switches that they remain in a high impedance state until the integral of voltage over time has reached a certain critical value. When sufficient volt-seconds have been applied to the nonlinear magnetic switch 76, it rapidly becomes of very low impedance, and all of the pulse receiving capacitors 82 discharge simultaneously. The relative values of the capacitances 82 and inductances 84, and of the mutual inductance between adjoining inductances 84, may be used to obtain a pulse of the desired width, and to match the output impedance of the pulse charging network 74 with the input impedance of the load 16. Such calculations are apparent to those having skill in the art.

INDUSTRIAL APPLICABILITY

The present invention is capable of exploitation in industry whenever it is desired to produce high voltage pulse power. Such high voltage pulse power is especially useful for providing power to, for example, carbon dioxide lasers. The present invention may be made from the discrete electronic components described herein, or from their monolithic equivalents, or both.

While a specific embodiment of the present invention has been described, the present invention is not limited thereto, but has the scope and spirit shown by the appended claims.

What is claimed is:

1. A high voltage pulse power converter comprising a nonlinear magnetic switch (76) and a ladder (74) of pulse forming network charging elements (78), the nonlinear magnetic switch (76) and the ladder (74) being connected in series, and each charging element (78) including means (98, 100) for receiving low voltage power (102), and means (110) for transforming said low voltage power to high voltage power.

2. A high voltage pulse power converter comprising a nonlinear magnetic switch (76) and a ladder (74) of pulse forming network charging elements (78), the nonlinear magnetic switch (76) and the ladder (74) being connected in series, and each charging element (78) including means (98, 100) for receiving low voltage power (102), wherein:
   (a) each charging element (78) comprises:
      (1) a shunt section connected between a first node (86) and a second node (88), the shunt section comprising a pulse charging module (80) and a pulse receiving capacitor (82), the pulse charging module (80) and the pulse receiving capacitor (82) being connected in parallel, the pulse charging module (80) including the means (98, 100) for receiving low voltage power (102), and the pulse charging module (80) including means for producing and delivering high voltage power (110) to the pulse receiving capacitor (82); and
      (2) a series section connected between the second node (88) and a third node (90), the series section comprising an inductance (84);
   (b) the first node (86) of each element (78) other than a highest element (94) is connected to the first node (86) of a next higher element (78), thereby forming a common first node (92) of the ladder (74);
   (c) the third node (90) of each element (78) other than the highest element (94) is connected to the second node (88) of the next higher element (78), the third node (96) of the highest element (94) forming a third node (96) of the ladder (74); and
   (d) the nonlinear magnetic switch (76) is connected in series with the first (92) or third (96) node of the ladder (74).

3. The high voltage pulse power converter of claim 2, wherein each charging module (80) comprises:
   (a) an intermediate storage capacitor (104) connected to be charged by the low voltage pulse power receiving means (98, 100);
   (b) a voltage step up transformer (110) including a primary winding (108) and a secondary winding (120);
   (c) means (106) for intermittently discharging the intermediate storage capacitor (104) through the primary winding (108); and
   (d) means (124) for outputting high voltage pulse power from the secondary winding (120) to the pulse receiving capacitor (82).

4. A method of converting low voltage power to high voltage pulse power, comprising:
   (a) transforming, at each of a plurality of ladder connected charging elements (78), low voltage power to high voltage power;
   (b) charging each charging element (78) with the high voltage power;
   (c) discharging each charging element (78) other than a highest charging element (94) into a next higher charging element (78); and
   (d) discharging the highest charging element (94) through a nonlinear magnetic switch (76).

5. The method of claim 4, wherein:
   (a) each charging element (78) is charged by receiving low voltage power at a pulse charging module (80), transforming the low voltage power to high voltage power, and delivering the high voltage power to the pulse receiving capacitor (82), the pulse charging module (80) and the pulse receiving capacitor (82) being connected in parallel and being comprised in a shunt section of a ladder (74) between a first node (86) and a second node (88);
   (b) each charging element (78) is discharged by discharging the pulse receiving capacitor (82) through an inductance (84), the inductance (84) being comprised in a series section of the ladder (74) between the second node (88) and a third node (90), the third node (90) of each element (78) except the highest element (94) being connected to the second node (88) of the next higher element (78), the third node (96) of the highest element (94) forming a third node (96) of the ladder (74), and the first node (86) of each element (78) other than the highest element (94) being connected with the first node (86) of the next higher element (78), thereby forming a common first node (92) of the ladder (74); and
   (c) the discharge of the charging elements (78) is controlled by a nonlinear magnetic switch (76) connected to the first (92) or third (96) node of the ladder (74).

6. The method of claim 5, wherein the step of charging each charging element (78) comprises:
   (a) charging an intermediate storage capacitor (104) with the low voltage power;
   (b) intermittently discharging the intermediate storage capacitor (104) through a primary winding (108) of a transformer (110); and
   (c) outputting pulsed power from a secondary winding (120) of the transformer (110) to the pulse receiving capacitor.

* * * * *